US010424488B2

(12) United States Patent
Okita et al.

(10) Patent No.: US 10,424,488 B2
(45) Date of Patent: Sep. 24, 2019

(54) METHOD OF MANUFACTURING ELECTRONIC COMPONENT

(71) Applicant: Panasonic Intellectual Property Management Co., Ltd., Osaka (JP)

(72) Inventors: Shogo Okita, Hyogo (JP); Atsushi Harikai, Osaka (JP)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 0 days.

(21) Appl. No.: 16/009,352

(22) Filed: Jun. 15, 2018

(65) Prior Publication Data

US 2018/0294164 A1 Oct. 11, 2018

Related U.S. Application Data

(63) Continuation of application No. 15/426,192, filed on Feb. 7, 2017, now Pat. No. 10,026,619.

(30) Foreign Application Priority Data

Mar. 3, 2016 (JP) .................................. 2016-040584

(51) Int. Cl.
*H01L 21/3065* (2006.01)
*H01L 21/308* (2006.01)
(Continued)

(52) U.S. Cl.
CPC ........ *H01L 21/3065* (2013.01); *H01L 21/308* (2013.01); *H01L 21/30655* (2013.01);
(Continued)

(58) Field of Classification Search
CPC ........... H01L 21/3065; H01L 21/30655; H01L 21/308; H01L 21/67109; H01L 21/67115; H01L 21/677; H01L 21/6831; H01L 21/68742; H01L 21/68785; H01L 21/78
USPC ....... 216/58, 67; 156/345.3, 345.34, 345.37; 438/716, 67, 68, 714
See application file for complete search history.

(56) References Cited

U.S. PATENT DOCUMENTS

2002/0102864 A1  8/2002  Rossman
2008/0237030 A1  10/2008  Aoto et al.
(Continued)

FOREIGN PATENT DOCUMENTS

JP    S49-068657 A    7/1974
JP    H06-334033 A    12/1994
(Continued)

*Primary Examiner* — Lan Vinh
(74) *Attorney, Agent, or Firm* — Pearne & Gordon LLP

(57) ABSTRACT

The yield of a product is improved when a substrate held by a conveyance carrier is subjected to a plasma treatment. A method of manufacturing an electronic component includes preparing a substrate which is bonded to a holding sheet of a conveyance carrier, the conveyance carrier including the holding sheet and a frame disposed on an outer peripheral portion of the holding sheet, the substrate having a circuit layer; heating the holding sheet after preparing the substrate; cooling the holding sheet after heating the holding sheet; and plasma etching the substrate to singulate the substrate into the electronic component in a state that the substrate is placed above a stage included in a plasma treatment apparatus and the substrate is in contact with the stage via the holding sheet.

7 Claims, 8 Drawing Sheets

(51) Int. Cl.
*H01L 21/677* (2006.01)
*H01L 21/78* (2006.01)
*H01L 21/67* (2006.01)
*H01L 21/683* (2006.01)
*H01L 21/687* (2006.01)

(52) U.S. Cl.
CPC ...... *H01L 21/677* (2013.01); *H01L 21/67109* (2013.01); *H01L 21/67115* (2013.01); *H01L 21/6831* (2013.01); *H01L 21/68742* (2013.01); *H01L 21/68785* (2013.01); *H01L 21/78* (2013.01)

(56) References Cited

U.S. PATENT DOCUMENTS

| | | |
|---|---|---|
| 2009/0028671 A1 | 1/2009 | Jin et al. |
| 2010/0216313 A1* | 8/2010 | Iwai .................. H01J 37/32623 438/729 |
| 2012/0312468 A1 | 12/2012 | Taga et al. |
| 2013/0084661 A1 | 4/2013 | Yasuda |
| 2013/0295775 A1 | 11/2013 | Iwai |
| 2014/0127885 A1* | 5/2014 | Grivna .................... H01L 21/78 438/464 |
| 2014/0335696 A1* | 11/2014 | Nishizaki ............ H01L 21/3065 438/710 |

FOREIGN PATENT DOCUMENTS

| | | |
|---|---|---|
| JP | H10-209275 A | 8/1998 |
| JP | 2000-332036 A | 11/2000 |
| JP | 2002-305236 A | 10/2002 |
| JP | 2008-251904 A | 10/2008 |
| JP | 2009-094436 A | 4/2009 |
| JP | 2009-266909 A | 11/2009 |
| JP | 2013-197117 A | 9/2013 |

* cited by examiner

METHOD OF MANUFACTURING ELECTRONIC COMPONENT

RELATED APPLICATION

This application is a continuation of U.S. patent application Ser. No. 15/426,192 filed Feb. 7, 2017, which is incorporated herein by reference in its entirety.

BACKGROUND

1. Technical Field

The present disclosure relates to a method of manufacturing an electronic component.

2. Description of the Related Art

As a method of dicing a substrate, a plasma dicing method in which a substrate on which a resist mask is formed is subjected to plasma etching and divided into individual chips is known. Japanese Patent Unexamined Publication No. 2009-94436 discloses that a substrate is placed on a stage included in a plasma treatment apparatus and subjected to a plasma treatment in a state in which the substrate is held by a conveyance carrier including a frame and a holding sheet that covers an opening portion of the frame in order to improve handling property of the substrate during conveyance or the like.

A holding sheet has a small thickness and is easily deflected. Accordingly, a conveyance carrier holding a substrate is occasionally placed on a stage in a state in which the holding sheet is wrinkled. When a plasma treatment is performed in a state in which the holding sheet still has wrinkles, abnormal discharge occurs in the wrinkle portion or the temperature of the wrinkle portion is increased. Therefore, it is difficult to normally perform the plasma treatment.

SUMMARY

According to a first aspect of the present disclosure, there is provided a method of manufacturing an electronic component. In other words, the method of manufacturing the electronic component includes: preparing a substrate which is bonded to a holding sheet of a conveyance carrier, the conveyance carrier including the holding sheet and a frame disposed on an outer peripheral portion of the holding sheet, the substrate having a circuit layer. Further, the method of manufacturing the electronic component includes: heating the holding sheet after preparing the substrate; cooling the holding sheet after heating the holding sheet; and plasma etching the substrate to singulate the substrate into the electronic component in a state that the substrate is placed above a stage included in a plasma treatment apparatus and the substrate is in contact with the stage via the holding sheet.

According to the present disclosure, since the substrate is subjected to the plasma treatment in a state in which the holding sheet is not wrinkled, the yield of a product is improved.

DETAILED DESCRIPTION

Figure 1A:
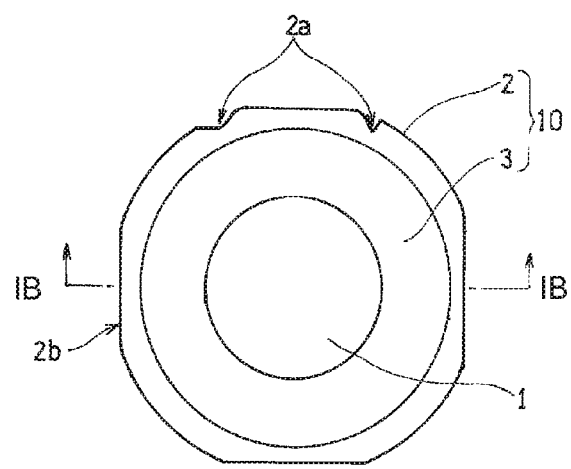
FIG. 1A is a top view schematically illustrating a conveyance carrier holding a substrate according to an embodiment of the present disclosure.

A holding sheet is typically wound in a roll shape. The holding sheet is bonded to one surface of a frame and is fixed thereto while being unwound so as to cover an opening of the frame placed on a base. At this time, the holding sheet is fixed to the frame in a state in which large tensile strength is applied to the unwinding direction. Therefore, wrinkles along the unwinding direction are easily generated on the holding sheet bonded to the frame.

In recent years, with reduction in size and thickness of an electronic device, the thickness of an IC chip or the like to be mounted on an electronic device has been decreased. Along with this, the thickness of a substrate used to form an IC chip or the like which is a target for dicing is also decreased and thus the substrate is easily deflected. When the rigidity of the substrate is small, the wrinkles of the holding sheet are not eliminated even if the substrate is bonded to the holding sheet and the wrinkles tend to be large due to its own weight. When the substrate is small with respect to the frame, the area proportion of a portion in the holding sheet which is not bonded to the substrate becomes large. Consequently, even in a case where the substrate has rigidity, wrinkles of the holding sheet become large when the substrate is bonded to the holding sheet.

The plasma treatment is typically performed by placing a conveyance carrier on a stage included in a plasma treatment apparatus and allowing the conveyance carrier to be adsorbed by an electrostatic adsorption mechanism referred to as an electrostatic chuck. In the electrostatic adsorption mechanism, a voltage is applied to an electrode for an electrostatic adsorption (electrostatic chuck) (hereinafter, referred to as an ESC electrode) disposed in the inside of the stage and the conveyance carrier is absorbed by the stage using Coulomb force or Johnsen-Rahbek force which is operated between the ESC electrode and the conveyance carrier. At this time, the conveyance carrier holding the substrate is occasionally adsorbed by the stage in a state in which the holding sheet is wrinkled. In this case, at least some wrinkles generated on the holding sheet do not come into contact with the stage and thus the holding sheet is adsorbed by the stage in a state in which a part of the holding sheet floats up from the stage.

In a case where such a floating-up portion is generated in a region in which the substrate is bonded to the holding sheet, if the plasma treatment is performed in this state, etching between the floating-up portion and other portions becomes non-uniform so that a variation in processing shape or an un-processed portion is generated. Further, the temperature of a local portion in the floating-up portion is increased or abnormal discharge may occur. Due to the increase in temperature or abnormal discharge, there is a concern that the substrate, the holding sheet, or the ESC electrode may be damaged. In addition, due to the increase in temperature, the holding sheet is extended so that the wrinkles become large in some cases. As the result, a variation in processing shape, generation of an un-processed portion, and a local increase in temperature described above become more significant. When the holding sheet is wrinkled, since it becomes difficult to accurately recognize a chip in a pickup process after the plasma treatment, pickup errors may occur. Further, in an appearance inspection process carried out after the pickup process, it may not accurately distinguish non-defective products from defective products.

In the present embodiment, a tensile strength increasing process of shrinking the holding sheet to increase the tensile strength of the holding sheet is performed between a preparation process of preparing the conveyance carrier which includes the holding sheet and the frame disposed on the outer peripheral portion of the holding sheet and a plasma treatment process performed on the substrate. By performing the tensile strength increasing process, the tensile strength of the holding sheet is more increased than that of the holding sheet before the substrate is bonded thereto. That is, wrinkles of the holding sheet are eliminated by stretching the holding sheet between the substrate and the frame.

Figure 1B:
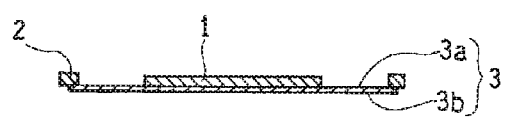
FIG. 1B is a sectional view taken along the line IB-IB of the conveyance carrier holding the substrate according to the embodiment of the present disclosure.

First, a conveyance carrier according to an embodiment of the present disclosure will be described with reference to FIGS. 1A and 1B. FIG. 1A is a top view schematically illustrating substrate 1 and conveyance carrier 10 holding substrate 1 and FIG. 1B is a sectional view of substrate 1 and conveyance carrier 10, which is taken along the line IB-IB illustrated in FIG. 1A. As illustrated in FIG. 1A, conveyance carrier 10 includes frame 2 and holding sheet 3. The outer peripheral portion of holding sheet 3 is fixed to frame 2. Substrate 1 is bonded to holding sheet 3 and is held by conveyance carrier 10. Further, FIGS. 1A and 1B illustrate a case where both of frame 2 and substrate 1 are substantially circular, but the shape thereof is not limited thereto.

(Substrate)

Substrate 1 is an object for the plasma treatment. Substrate 1 is prepared by forming a circuit layer such as a semiconductor circuit, an electronic component element, or a MEMS on one surface of the main body portion and grinding the rear surface of the main body portion on the opposite side of the circuit layer, and reducing the thickness. When substrate 1 is individuated, an electronic component (not illustrated) having the above-described circuit layer is obtained.

The size of substrate 1 is not particularly limited. For example, the maximum diameter thereof is approximately in a range of 50 mm to 300 mm. The thickness of substrate 1 is typically in a range of 25 μm to 150 μm, which is extremely thin. Accordingly, substrate 1 does not almost have rigidity (self-supporting property). The outer peripheral portion of holding sheet 3 is fixed to frame 2 which is substantially flat and substrate 1 is bonded to holding sheet 3. In this manner, conveyance or the like of substrate 1 is easily handled. The shape thereof is not particularly limited, and examples thereof include a circle and a square. Further, substrate 1 may be provided with an orientation flat or a notch (both not illustrated).

The material of the main body portion of substrate 1 is not also particularly limited, and examples thereof include a semiconductor, a dielectric, a metal, and a laminate of these. Examples of the semiconductor include silicon (Si), gallium arsenide (GaAs), gallium nitride (GaN), and silicon carbide (SiC). Examples of the dielectric include silicon dioxide ($SiO_2$), silicon nitride ($Si_3N_4$), polyimide, lithium tantalate ($LiTaO_3$), and lithium niobate ($LiNbO_3$).

A resist mask (not illustrated) is formed, in a desired shape, on a surface of substrate 1 which is not bonded to holding sheet 3. A portion on which a resist mask is formed is protected from being etched due to plasma. A portion on which a resist mask is not formed may be etched from the surface to the rear surface thereof due to plasma.

(Frame)

Frame 2 has an opening having an area greater than or equal to the entire area of substrate 1 and has a predetermined width and a substantially constant small thickness. Frame 2 has rigidity to the extent that frame 2 is capable of conveying holding sheet 3 and substrate 1 in a state of holding them.

The shape of the opening of frame 2 is not particularly limited, and examples thereof include polygons such as a circle, a square, and a hexagon. Frame 2 may be provided with notch 2a or corner cut 2b for positioning. Examples of the material of frame 2 include metals such as aluminum and stainless steel and resins. The vicinity of the outer peripheral edge of one surface of holding sheet 3 is bonded to one surface of frame 2.

(Holding Sheet)

Holding sheet 3 includes a surface (adhesive surface 3a) having an adhesive and a surface (non-adhesive surface 3b) which does not have an adhesive. The outer peripheral edge of adhesive surface 3a is bonded to one surface of frame 2 and covers an opening of frame 2. Further, substrate 1 is bonded to a portion exposed from the opening of frame 2 of adhesive surface 3a.

It is preferable that adhesive surface 3a is formed of an adhesive component having adhesive force which is decreased when irradiated with ultraviolet rays (UV light). Since an individuated substrate (electronic component) is easily peeled off from adhesive surface 3a when irradiated with UV light after dicing, the substrate can be easily picked up. For example, holding sheet 3 can be obtained by coating one surface of a film-like base material with a UV-curable acrylic adhesive at a thickness of 5 µm to 20 µm.

The material of the film-like base material is not particularly limited, and examples thereof include thermoplastic resins, for example, polyolefin such as polyethylene or polypropylene and polyester such as polyethylene terephthalate. Various additives such as a rubber component (such as ethylene-propylene rubber (EPM) or ethylene-propylene-diene rubber (EPDM)) for providing elasticity, a plasticizer, a softener, an antioxidant, and a conductive material may be blended in the base material. The above-described thermoplastic resin may include a functional group showing a photopolymerization reaction, such as an acrylic group. For example, the thickness of the base material is in a range of 50 µm to 150 µm. During the plasma treatment, conveyance carrier 10 is placed on the stage such that the stage comes into contact with non-adhesive surface 3b.

(Plasma Treatment Apparatus)

Figure 2:
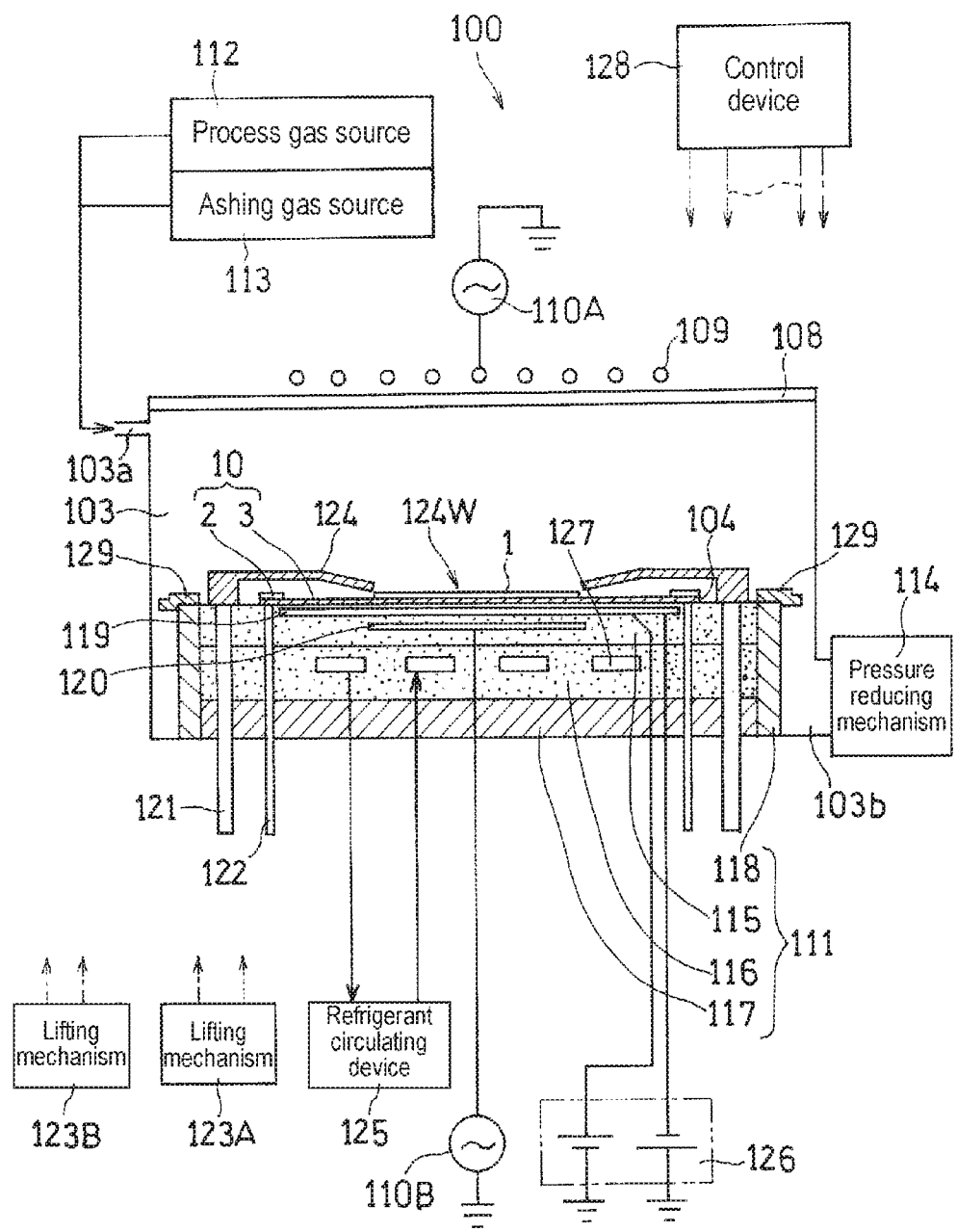
FIG. 2 is a conceptual sectional view illustrating a schematic structure of a plasma treatment apparatus according to the embodiment of the present disclosure.

Next, plasma treatment apparatus 100 of the present embodiment will be described with reference to FIG. 2. FIG. 2 schematically illustrates a section of the structure of plasma treatment apparatus 100 according to the embodiment.

Plasma treatment apparatus 100 includes stage 111. Conveyance carrier 10 is placed on stage 111 such that the surface (adhesive surface 3a) holding substrate 1 of holding sheet 3 faces upward. Cover 124 which covers at least a part of frame 2 and holding sheet 3 and includes window portion 124W for exposing at least a part of substrate 1 is disposed over stage 111.

Stage 111 and cover 124 are disposed in reaction chamber (vacuum chamber 103). Vacuum chamber 103 has a substantially cylindrical shape with an open upper portion and the opening of the upper portion is closed by dielectric member 108 serving as a lid. Examples of the material constituting vacuum chamber 103 include aluminum, stainless steel (SUS), and aluminum whose surface is alumite-processed. Examples of the material constituting dielectric member 108 include dielectric materials such as yttrium oxide ($Y_2O_3$), aluminum nitride (AlN), alumina ($Al_2O_3$), and quartz ($SiO_2$). Antenna 109 serving as an upper electrode is disposed over dielectric member 108. Antenna 109 is electrically connected to first high-frequency power source 110A. Stage 111 is disposed on the bottom side in vacuum chamber 103.

Gas introduction port 103a is connected to vacuum chamber 103. Process gas source 112 and ashing gas source 113 which are sources of supplying gas for generating plasma are respectively connected to gas introduction port 103a through a pipe. Further, exhaust port 103b is provided in vacuum chamber 103, and pressure reducing mechanism 114 including a vacuum pump for reducing the pressure by exhausting the gas inside of vacuum chamber 103 is connected to exhaust port 103b.

Stage 111 includes electrode layer 115, metal layer 116, base 117 supporting electrode layer 115 and metal layer 116, and outer peripheral portion 118 surrounding electrode layer 115, metal layer 116, and base 117, which are respectively in a substantially circular shape. Outer peripheral portion 118 is formed of a metal having conductivity and etching resistance and protects electrode layer 115, metal layer 116, and base 117 from plasma. Annular outer peripheral ring 129 is disposed on the upper surface of outer peripheral portion 118. Outer peripheral ring 129 has a role of protecting the upper surface of outer peripheral portion 118 from plasma. Electrode layer 115 and outer peripheral ring 129 are formed of, for example, the above-described dielectric materials.

ESC electrode 119 constituting the electrostatic adsorption mechanism and high-frequency electrode 120 electrically connected to second high-frequency power source 110B are disposed in the inside of electrode layer 115. DC power source 126 is electrically connected to ESC electrode 119. The electrostatic adsorption mechanism is configured of ESC electrode 119 and DC power source 126.

Metal layer 116 is formed of, for example, aluminum whose surface is coated with alumite. Refrigerant channel 127 is formed in metal layer 116. Refrigerant channel 127 cools stage 111. When stage 111 is cooled, holding sheet 3 mounted on stage 111 is cooled and cover 124 having a portion in contact with stage 111 is also cooled. In this manner, damage to substrate 1 or holding sheet 3 by being heated during the plasma treatment is prevented. A refrigerant in refrigerant channel 127 is circulated by refrigerant circulating device 125.

A plurality of support portions 122 penetrating stage 111 are disposed in the vicinity of outer periphery of the stage 111. Support portions 122 are vertically driven by lifting mechanism 123A. When conveyance carrier 10 is conveyed to the inside of vacuum chamber 103, conveyance carrier 10 is transferred to support portions 122 elevated to a predetermined position. Support portions 122 support frame 2 of conveyance carrier 10. The upper end surfaces of support portions 122 are lowered to lower than or equal to the same level as stage 111, conveyance carrier 10 is mounted on a predetermined position of stage 111.

A plurality of lifting rods 121 are connected to the end portion of cover 124 so that cover 124 can be lifted and lowered. Lifting rods 121 are vertically driven by lifting mechanism 123B. An operation of lifting and lowering cover 124, by lifting mechanism 123B, can be performed independently from lifting mechanism 123A.

Control device 128 controls operations of elements constituting plasma treatment apparatus 100 that includes first high-frequency power source 110A, second high-frequency power source 110B, process gas source 112, ashing gas source 113, pressure reducing mechanism 114, refrigerant circulating device 125, lifting mechanism 123A, lifting mechanism 123B, and the electrostatic adsorption mechanism.

(Tensile Strength Increasing Process)

The tensile strength increasing process of increasing the tensile strength of holding sheet 3 will be described. The tensile strength increasing process is performed between a preparation process of preparing conveyance carrier 10 and a plasma treatment process of performing the plasma treatment on substrate 1. In other words, the tensile strength increasing process is performed after the preparation process is finished and before the plasma treatment process is started.

Holding sheet 3 formed of the above-described thermoplastic resin is extended by being heated and is more shrunk when cooled to the original temperature compared to the state before being heated. Holding sheet 3 is typically obtained by melting a thermoplastic resin, extruding the thermoplastic resin from a die to form a sheet-like material, and roll-pressing the sheet-like material. Accordingly, the residual stress in a pulling direction remains in molded holding sheet 3 and holding sheet 3 is more extended compared to a case where the residual stress is not operated. Holding sheet 3 is further extended and the residual stress in the pulling direction which remains in holding sheet 3 is relieved by heating such holding sheet 3. Therefore, when holding sheet 3 is cooled after the residual stress is relieved, holding sheet 3 is more shrunk compared to the state before being heated. At this time, the outer peripheral portion of holding sheet 3 is fixed to frame 2. Therefore, the tensile strength of holding sheet 3 is more increased than that of holding sheet 3 before being extended. Consequently, wrinkles of holding sheet 3 are eliminated. The tensile strength increasing process may be performed using such properties of holding sheet 3. That is, the tensile strength increasing process may include a heating step of heating holding sheet 3 so as to be extended and a cooling step of cooling extended holding sheet 3 so as to be shrunk.

Meanwhile, holding sheet 3 may have a property of being shrunk when irradiated with UV light in some cases (for example, a case where the material of holding sheet 3 includes a functional group showing a photopolymerization reaction, such as an acrylic group). In this case, the tensile strength increasing process may include an ultraviolet ray irradiation step (hereinafter, referred to as an UV irradiation step) of irradiating holding sheet 3 with UV light so as to be shrunk, in place of the above-described heating step and cooling step. Even in this case, holding sheet 3 is more shrunk compared to the state of holding sheet 3 before being irradiated with UV light. A process of cooling holding sheet 3 after the UV irradiation step is not necessarily required, but it is preferable that holding sheet 3 is cooled in a case where holding sheet 3 is heated by the UV irradiation step. The cooling of holding sheet 3 can be performed using the same method as in the above-described cooling step.

Hereinafter, the tensile strength increasing process will be described in detail by dividing the tensile strength increasing process into (1) a case where the tensile strength increasing process includes a heating step and a cooling step and (2) a case where the tensile strength increasing process includes a UV irradiation step.

(1) Case where Tensile Strength Increasing Process Includes Heating Step and Cooling Step
(Heating Step)

The heating step may be performed by heating holding sheet 3 of conveyance carrier 10 before holding substrate 1 (after the preparation process and before a substrate holding process described below) or may be performed by heating holding sheet 3 of conveyance carrier 10 after holding substrate 1 (after the substrate holding process and before the plasma treatment process). The conditions of heating holding sheet 3 are not particularly limited and may be appropriately set according to the material and the thickness of holding sheet 3. From the viewpoint of preventing damage to holding sheet 3, it is preferable that holding sheet 3 is heated such that the temperature of the surface is in a range of 50° C. to 60° C.

The method of heating holding sheet 3 is not particularly limited, and holding sheet 3 may be heated from the top using a heating device after being placed on a base or holding sheet 3 may be heated after being placed on a hot plate or the like. Holding sheet 3 may be heated using a UV irradiation device (UV lamp or the like) that radiates UV light. From the viewpoint of controlling a portion of holding sheet 3 to be heated, it is preferable that holding sheet 3 is heated by a UV irradiation device. In a case where holding sheet 3 is heated using a UV irradiation device, the heating portion can be controlled by masking a portion which is not intended to be heated so that UV light is shielded. Particularly, in a case where adhesive surface 3a of holding sheet 3 is formed of a UV curable acrylic adhesive, it is preferable that the heating portion is irradiated with UV light after a portion facing frame 2 of holding sheet 3 and a portion facing a predetermined region of holding sheet 3 to which substrate 1 is to be bonded or a region of holding sheet 3 to which substrate 1 is bonded are masked. The masking is carried out for preventing a decrease in adhesive force of adhesive surface 3a due to the irradiation with UV light or preventing excessive progression of curing of adhesive surface 3a which may lead to difficulty in picking up of substrate 1. From the above-described viewpoint, it is preferable that holding sheet 3 to which substrate 1 is bonded is irradiated with UV light from the surface side (adhesive surface 3a) to which substrate 1 and frame 2 are bonded. This is because UV light can be shielded by substrate 1 and frame 2.

The heating step may be performed in the inside or outside plasma treatment apparatus 100. In a case where the heating step is performed in the inside of plasma treatment apparatus 100, the heating step may be performed after holding sheet 3 (that is, conveyance carrier 10 holding substrate 1) is placed on stage 111 or may be performed before conveyance carrier 10 is placed on stage 111 (for example, the time until support portions 122 are lowered to lower than or equal to the same level as stage 111 after conveyance carrier 10 is transferred to support portions 122 as described below). In a case where stage 111 is cooled, it is preferable that the heating step is performed before conveyance carrier 10 is placed on stage 111 and before a voltage is applied to ESC electrode 119.

Holding sheet 3 can be irradiated with UV light using a UV irradiation device. Here, plasma may generate a bright line spectrum having a wavelength in a UV range. That is, UV light is applied by generating plasma. For example, holding sheet 3 can be irradiated with UV light by supplying a weak high-frequency power to vacuum chamber 103 in a state in which cover 124 is elevated and generating weak plasma after conveyance carrier 10 is carried in vacuum chamber 103. At this time, it is preferable that gas (for example, helium or argon) which is likely to generate UV light is introduced to vacuum chamber 103.

(Cooling Step)

The cooling step is performed after the heating step is finished and before the plasma treatment process is started. It is preferable that the cooling step is performed by cooling holding sheet 3 of conveyance carrier 10 holding (after the substrate holding process is finished) substrate 1. In this case, wrinkles of a region in which substrate 1 is not bonded to holding sheet 3 and a region in which substrate 1 is bonded to holding sheet 3 are eliminated. In other words, substrate 1 is bonded to holding sheet 3 which is not wrinkled by performing the cooling step. Since the tensile strength is easily applied to the region in which substrate 1 is not bonded to holding sheet 3, between the region in which substrate 1 is bonded to holding sheet 3 and frame 2, the effect of eliminating wrinkles becomes high.

The method of cooling holding sheet 3 is not particularly limited and holding sheet 3 may be placed at room temperature (approximately 20° C.). Specifically, the cooling step may be performed by allowing conveyance carrier 10 to stand on a base after the heating step or may be performed by allowing conveyance carrier 10 to stand on a hot plate after the hot plate is turned off. Another cooling step may be performed by placing conveyance carrier 10 at room temperature during the time when conveyance carrier 10 is carried in vacuum chamber 103 (during a carrying-in process described below). Further, as the cooling step, the above-described two cooling steps may be both performed.

For example, holding sheet 3 may be cooled to room temperature or lower by being placed on stage 111 of plasma treatment apparatus 100 which is a cooling plate. Stage 111 is cooled to, for example, approximately 15° C. using a refrigerant constantly circulating in refrigerant channel 127. Therefore, holding sheet 3 is cooled by placing conveyance carrier 10 on stage 111 and bringing holding sheet 3 into contact with stage 111. In a case where the heating step is performed by being irradiated with UV light generated by plasma, holding sheet 3 may be cooled using a method of decreasing high-frequency power (weakening UV light to be radiated) supplied to vacuum chamber 103. Examples of other methods of cooling holding sheet 3 include a method of applying a voltage to the ESC electrode and allowing stage 111 to adsorb the holding sheet and a method of decreasing high-frequency power to be supplied to vacuum chamber 103 and introducing gas such as helium to vacuum chamber 103.

That is, the cooling step (the cooling of holding sheet 3) may be performed after the heating step and before the plasma treatment process without using a particular cooling device. The conditions for cooling are not particularly limited and may be appropriately set according to the material or the thickness of holding sheet 3. From a viewpoint of preventing damage to holding sheet 3, it is preferable that holding sheet 3 is cooled such that the temperature of the surface thereof is in the range of −10° C. to 20° C.

As described above, the cooling step may be performed in the inside or outside plasma treatment apparatus 100 or may be performed in both of the inside or outside plasma treatment apparatus 100. For example, after the heating step is performed outside plasma treatment apparatus 100, the cooling step may be performed during conveyance from the outside to the inside of plasma treatment apparatus 100 and in the inside of plasma treatment apparatus 100. The heating step and the cooling step may be performed outside plasma treatment apparatus 100 or the heating step and the cooling step may be performed in the inside of plasma treatment apparatus 100.

(2) Case where Tensile Strength Increasing Process Includes UV Irradiation Step

Similar to the cooling step, it is preferable that the UV irradiation step is performed on holding sheet 3 of conveyance carrier 10 holding substrate 1. The UV irradiation step may be performed in the inside or outside plasma treatment apparatus 100. The UV irradiation step can be performed using the same method as in the heating step for which irradiation with UV light is used.

In a case where holding sheet 3 is irradiated with UV light, it is not important to distinguish whether the irradiation with UV light corresponds to the above-described heating step or the above-described UV irradiation step. This is because holding sheet 3 is occasionally shrunk and heated when irradiated with UV light. In any of the cases, since holding sheet 3 is cooled during the time before the plasma treatment process, as the result, the tensile strength of holding sheet 3 is increased by performing irradiation with UV light. In other words, the irradiating of holding sheet 3 with UV light is a behavior (tensile strength increasing process) of increasing the tensile strength of holding sheet 3. In a first embodiment and a third embodiment described below, for convenience of description, the irradiating of holding sheet 3 with UV light is described as a heating step.

(First Embodiment)

Figure 3:
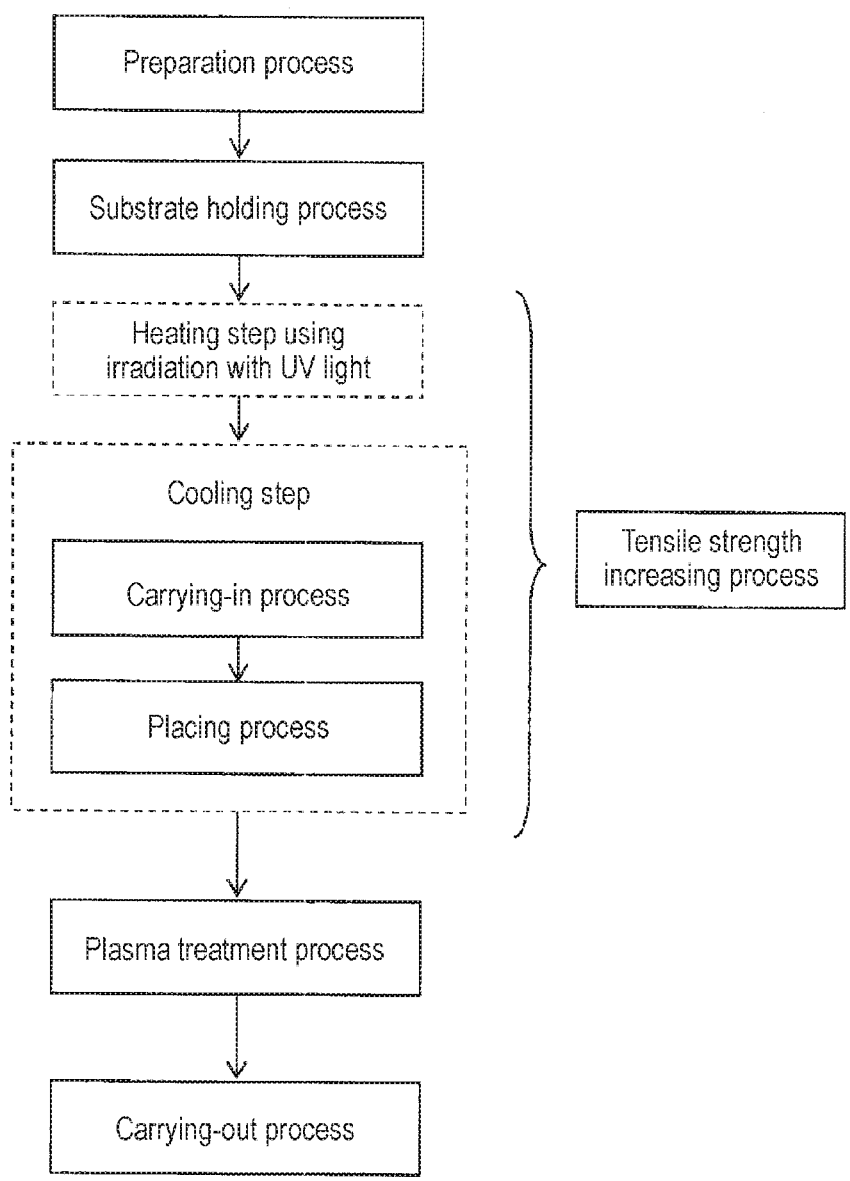
FIG. 3 is a flowchart showing a plasma treatment method according to a first embodiment of the present disclosure.

Hereinafter, the first embodiment which includes, as the tensile strength increasing process, the heating step of heating holding sheet 3 by performing irradiation with UV light so as to be extended and a cooling step of cooling holding sheet 3 so as to be shrunk will be described with reference to the accompanying drawings. In the present embodiment, the heating step is performed outside plasma treatment apparatus 100 before the carrying-in process is started and after the substrate holding process is finished. The cooling step is performed during conveyance from the outside to the inside of plasma treatment apparatus 100 and in the inside of plasma treatment apparatus 100 before the plasma treatment process is started and after the heating step is finished. Specific processes performed according to the plasma treatment method of the present embodiment will be described with reference to FIGS. 3 and 4A to 4F. FIG. 3 is a flowchart showing the plasma treatment method and FIGS. 4A to 4F are conceptual views illustrating a part of the plasma treatment method of the present embodiment.

(1) Preparation Process

In the present process, conveyance carrier 10 is prepared. In conveyance carrier 10, for example, holding sheet 3 wound in a roll shape is unwound so as to cover the opening of frame 2 placed on a base (not illustrated), bonded, and fixed to one surface of frame 2. At this time, as illustrated in FIG. 1B, adhesive surface 3a of holding sheet 3 is allowed to face the frame.

Figure 4A:
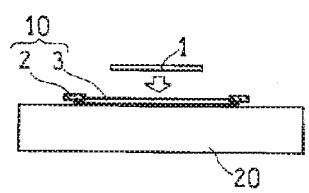
FIG. 4A is a conceptual view illustrating a part of the plasma treatment method according to the first embodiment.
Figure 4B:
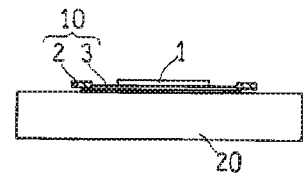
FIG. 4B is a conceptual view illustrating a part of the plasma treatment method according to the first embodiment.

(2) Substrate Holding Process (FIGS. 4A and 4B)

Next, substrate 1 is held by conveyance carrier 10 by placing conveyance carrier 10 on base 20 such that adhesive surface 3a faces upward and bonding substrate 1 to adhesive surface 3a. In FIG. 4A, substrate 1 is bonded to holding sheet 3 of conveyance carrier 10 placed on base 20, but the embodiment is not limited thereto. For example, substrate 1 may be bonded to holding sheet 3 by placing substrate 1 on base 20 so as to cover conveyance carrier 10.

Figure 4C:
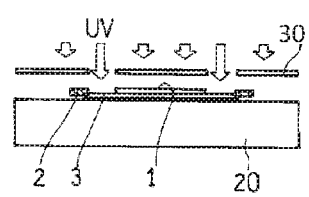
FIG. 4C is a conceptual view illustrating a part of the plasma treatment method according to the first embodiment.

(3) Tensile Strength Increasing Process (FIG. 4C)

Subsequently, holding sheet 3 is heated by performing irradiation with UV light so as to be extended (the heating step using irradiation with UV light). At this time, it is preferable that mask 30 is disposed such that a region to which frame 2 and substrate 1 of holding sheet 3 are bonded is covered. In a case where the thickness of substrate 1 is sufficiently large (for example, 100 μm or greater), the mask that covers the region to which substrate 1 of holding sheet 3 is bonded can be omitted. The irradiation with UV light is performed under conditions in which the temperature of the surface of holding sheet 3 is in a range of 50° C. to 60° C. In this manner, holding sheet 3 can be extended without being damaged. Further, in FIG. 4C, the irradiation with UV light is performed from the surface side (adhesive surface 3a) to which substrate 1 of holding sheet 3 is bonded, but the embodiment is not limited thereto. For example, the irradiation with UV light is performed from the surface side (non-adhesive surface 3b) to which substrate 1 of holding sheet 3 is not bonded. After the heating step, the cooling step is performed. In the present embodiment, holding sheet 3 is cooled and shrunk by placing holding sheet 3 on stage 111 at room temperature.

Figure 4D:
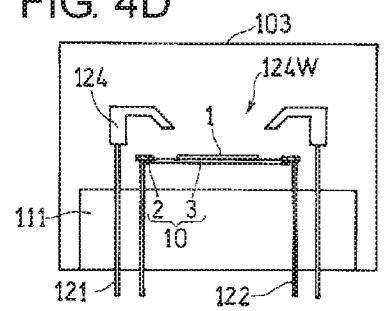
FIG. 4D is a conceptual view illustrating a part of the plasma treatment method according to the first embodiment.

(4) Carrying-in Process (FIG. 4D)

Next, conveyance carrier 10 holding substrate 1 is carried in vacuum chamber 103.

In vacuum chamber 103, lifting rods 121 are driven so that cover 124 is elevated to a predetermined position. Next, a gate valve (not illustrated) is open and conveyance carrier 10 is carried therein. When conveyance carrier 10 reaches a predetermined position in the upper portion of stage 111, a plurality of support portions 122 are elevated and support conveyance carrier 10. Conveyance carrier 10 is placed on the upper end surfaces of support portions 122 such that the surfaces holding substrate 1 of holding sheet 3 face upward.

Figure 4E:
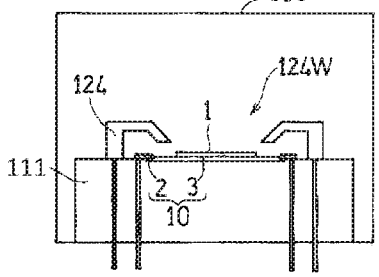
FIG. 4E is a conceptual view illustrating a part of the plasma treatment method according to the first embodiment.

(5) Placing Process (FIG. 4E)

When conveyance carrier 10 is transferred to support portions 122, the gate valve is closed and reaction chamber 103 enters a sealed state. Next, support portions 122 start lowering. When the upper end surfaces of support portions 122 are lowered to lower than or equal to the same level as stage 111, conveyance carrier 10 is placed on stage 111. Subsequently, lifting rods 121 are driven. Lifting rods 121 lower cover 124 to a predetermined position. At this time, the distance between cover 124 and stage 111 is adjusted such that cover 124 covers frame 2 without coming into contact with conveyance carrier 10. In this manner, portions of frame 2 and holding sheet 3 which do not hold substrate 1 are covered by cover 124 without coming into contact with cover 124 and substrate 1 is exposed from window portion 124W of cover 124. At this time, a voltage is applied to ESC electrode 119 (not illustrated in FIGS. 4A to 4F).

Cover 124 has, for example, a donut shape with an approximately circular outer contour and also has a constant width and a small thickness. The inner diameter of cover 124 (diameter of window portion 124W) is smaller than the inner diameter of frame 2 and the outer diameter of cover 124 is larger than the outer diameter of frame 2. Therefore, when conveyance carrier 10 is mounted on a predetermined position of the stage and cover 124 is lowered, cover 124 can cover at least a part of frame 2 and holding sheet 3. At least a part of substrate 1 is exposed from window portion 124W. At this time, cover 124 is not in contact with frame 2, holding sheet 3, and substrate 1. Cover 124 is formed of, for example, a dielectric such as ceramics (for example, alumina or aluminum nitride) or quartz; or a metal such as aluminum or aluminum whose surface is alumite-treated.

Figure 4F:
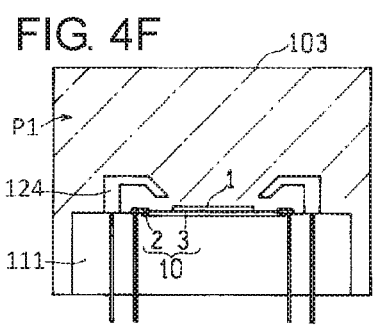
FIG. 4F is a conceptual view illustrating a part of the plasma treatment method according to the first embodiment.

(6) Plasma Treatment Process (FIG. 4F)

When support portions 122 and cover 124 are disposed in a predetermined position, process gas is introduced into the inside of vacuum chamber 103 by passing through gas introduction port 103a from process gas source 112 (see FIG. 2). Pressure reducing mechanism 114 exhausts gas in the inside of vacuum chamber 103 from exhaust port 103b so that a predetermined pressure is maintained in vacuum chamber 103.

Next, high-frequency power is supplied to antenna 109 from first high-frequency power source 110A to generate plasma P1 in the inside of vacuum chamber 103. Generated plasma P1 is formed of ions, electrons, and radicals. The area from the surface to the rear surface of the portion exposed from the resist mask formed on substrate 1 is removed (etched) by a physicochemical reaction with generated plasma P1, and then substrate 1 is individuated.

Here, for example, a high-frequency power of 100 kHz or greater may be supplied to high-frequency electrode 120 from second high-frequency power source 110B. The energy incident on substrate 1 of ions can be controlled using high-frequency power applied to high-frequency electrode 120 from second high-frequency power source 110B. When high-frequency power is supplied to high-frequency electrode 120, a bias voltage is generated on the surface of stage 111, ions incident on substrate 1 are accelerated by the bias voltage, and the etching rate is increased.

The conditions of etching are set according to the material or the like of substrate 1. For example, in a case where substrate 1 is made of Si, substrate 1 is etched by generating plasma P1 of fluorine-containing gas such as sulfur hexafluoride ($SF_6$) in vacuum chamber 103. In this case, for example, the pressure of vacuum chamber 103 is controlled to be in a range of 10 Pa to 50 Pa by pressure reducing mechanism 114 while supplying 100 sccm to 800 sccm of $SF_6$ gas from process gas source 112. At this time, 1000 W to 5000 W of high-frequency power at a frequency of 13.56 MHz is supplied to antenna 109 and 50 W to 1000 W of high-frequency power at a frequency of 400 to 500 kHz is supplied to high-frequency electrode 120. The frequency of high-frequency power supplied to high-frequency electrode 120 is not limited to 400 to 500 kHz and may be, for example, 13.56 MHz. Further, "sccm" is a unit of the flow rate and 1 sccm indicates an amount of gas flowing at 1 $cm^3$ for 1 minute in a standard state (0° C., 1 atm).

For the purpose of suppressing an increase in temperature of conveyance carrier 10 during etching, it is preferable that the temperature of the refrigerant circulated in stage 111 by refrigerant circulating device 125 is set to be 20° C. from −20° C. In this manner, the temperature of holding sheet 3 during the plasma treatment is controlled to 70° C. or lower. Therefore, thermal damage to holding sheet 3 is suppressed.

In a case of plasma dicing, it is desired that the surface of substrate 1 exposed from the resist mask is vertically etched. In this case, an etching step using plasma of fluorine-based gas such as $SF_6$ and a protective film deposition step using plasma of fluorocarbon gas such as perfluorocyclobutane ($C_4F_8$) may be alternately repeated as described above.

Substrate 1 is individuated by etching and then ashing is performed. Process gas for ashing (for example, oxygen gas or mixed gas of oxygen gas and gas containing fluorine) is introduced into vacuum chamber 103 from ashing gas source 113. Pressure reducing mechanism 114 exhausts gas in the inside of vacuum chamber 103 so that the pressure therein is maintained to a predetermined pressure. Oxygen plasma is generated in vacuum chamber 103 by supplying high-frequency power from first high-frequency power source 110A, and the resist mask on the surface of individuated substrate 1 (electronic component) exposed from window portion 124W of cover 124 is completely removed.

(7) Carrying-out Process

When the ashing is finished, the gas in vacuum chamber 103 is discharged and the gate valve is opened. Conveyance carrier 10 holding individuated substrate 1 is carried out from plasma treatment apparatus 100 by conveyance mechanism that has entered from the gate valve. When conveyance carrier 10 is carried out, the gate valve is promptly closed. The carrying-out process of conveyance carrier 10 may be performed in a reverse procedure to the procedure of mounting substrate 1 on stage 111 as described above. That is, after cover 124 is elevated to a predetermined position, the voltage applied to ESC electrode 119 is set to zero, adsorption of conveyance carrier 10 by stage 111 is released, and support portions 122 are elevated. After support portions 122 are elevated to a predetermined position, conveyance carrier 10 is carried out.

(Second Embodiment)

Figure 5:
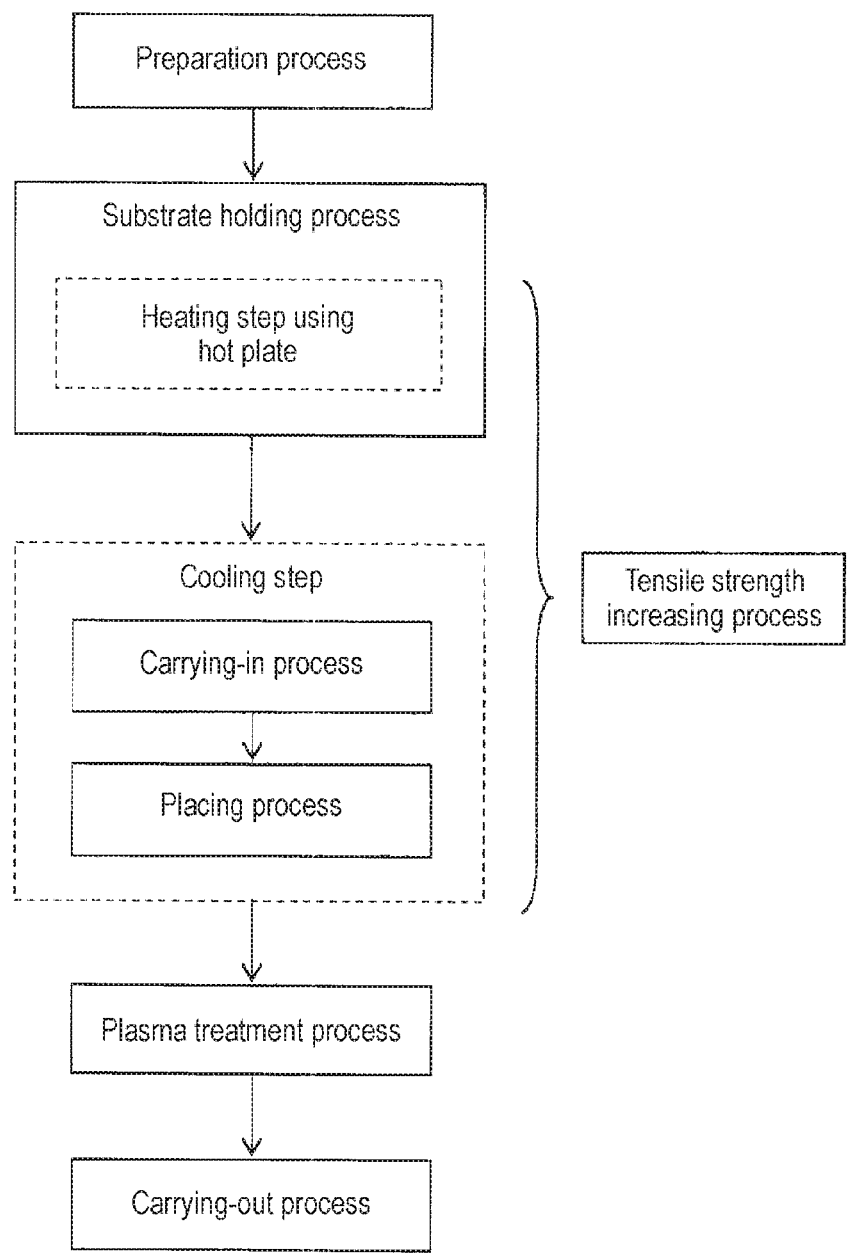
FIG. 5 is a flowchart showing a plasma treatment method according to a second embodiment of the present disclosure.

The present embodiment is the same as the first embodiment except that the heating step is started before substrate 1 is bonded to holding sheet 3 in the substrate holding process after the preparing process is finished; and the heating step is performed by heating holding sheet 3 using a hot plate. FIG. 5 is a flowchart showing a plasma treatment method. FIGS. 6A to 6E are views conceptually illustrating a part of the plasma treatment method of the present embodiment. FIGS. 6C to 6E correspond to FIGS. 4D to 4F.

Figure 6A:
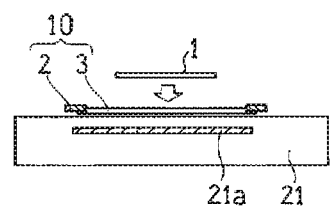
FIG. 6A is a conceptual view illustrating a part of the plasma treatment method according to the second embodiment.
Figure 6B:
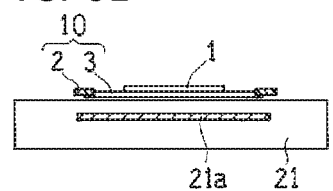
FIG. 6B is a conceptual view illustrating a part of the plasma treatment method according to the second embodiment.
Figure 6C:
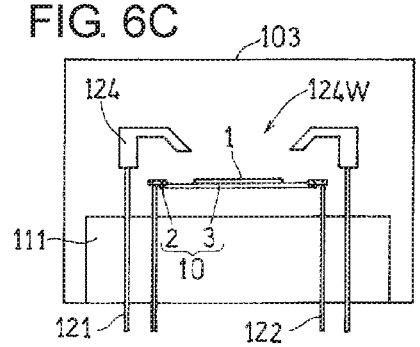
FIG. 6C is a conceptual view illustrating a part of the plasma treatment method according to the second embodiment.
Figure 6D:
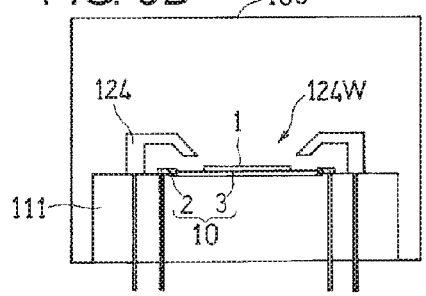
FIG. 6D is a conceptual view illustrating a part of the plasma treatment method according to the second embodiment.
Figure 6E:
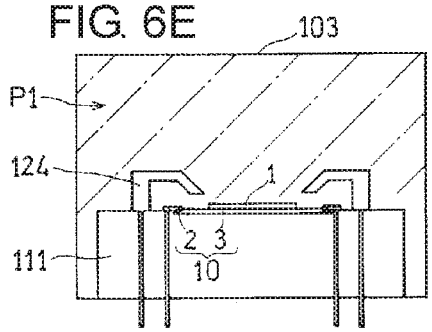
FIG. 6E is a conceptual view illustrating a part of the plasma treatment method according to the second embodiment.

In the present embodiment, as illustrated in FIGS. 6A and 6B, conveyance carrier 10 is placed on hot plate 21 that includes heater 21a and substrate 1 is bonded to holding sheet 3 while holding sheet 3 is heated or substrate 1 is bonded to heated holding sheet 3. Thereafter, substrate 1 is held by conveyance carrier 10 by holding sheet 3 being cooled and shrunk in a state in which substrate 1 is bonded to holding sheet 3 which is not wrinkled.

(Third Embodiment)

Figure 7:
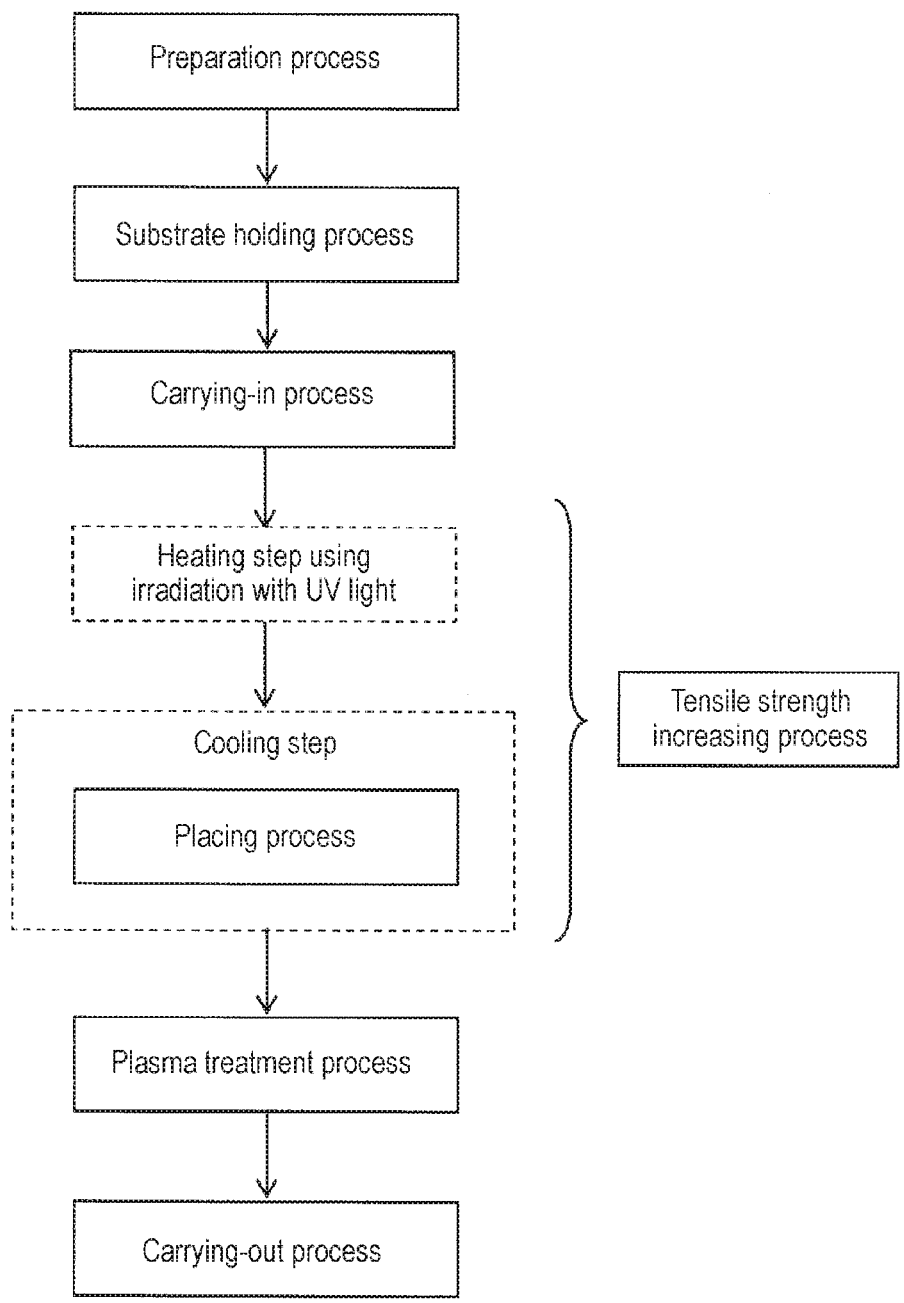
FIG. 7 is a flowchart showing a plasma treatment method according to a third embodiment of the present disclosure.
Figure 8A:
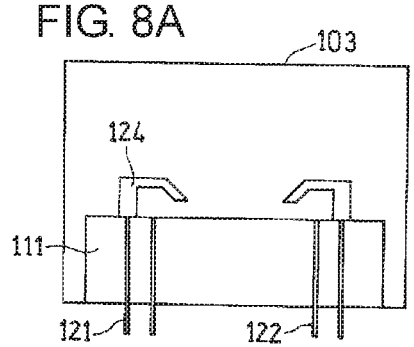
FIG. 8A is a conceptual view illustrating a part of the plasma treatment method according to the third embodiment.
Figure 8D:
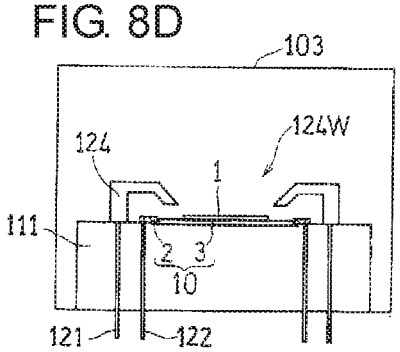
FIG. 8D is a conceptual view illustrating a part of the plasma treatment method according to the third embodiment.
Figure 8B:
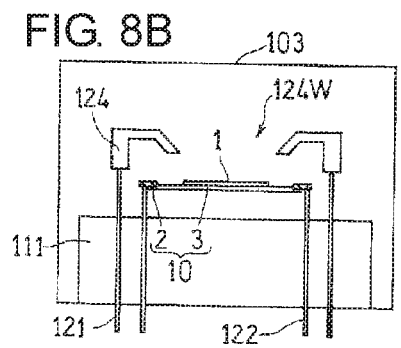
FIG. 8B is a conceptual view illustrating a part of the plasma treatment method according to the third embodiment.
Figure 8E:
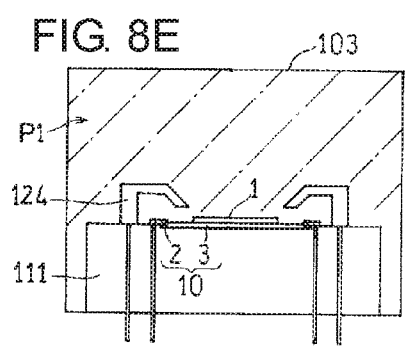
FIG. 8E is a conceptual view illustrating a part of the plasma treatment method according to the third embodiment.

The present embodiment is the same as the first embodiment except that the heating step using irradiation with UV light is performed after conveyance carrier 10 holding substrate 1 is carried in vacuum chamber 103; and holding sheet 3 is irradiated with UV light by generating weak plasma in the inside of vacuum chamber 103. FIG. 7 is a flowchart showing a plasma treatment method. FIGS. 8A to 8E are views conceptually illustrating a part of the plasma treatment method of the present embodiment. FIGS. 8B, 8D, and 8E correspond to FIGS. 4D, 4E, and 4F.

Figure 8C:
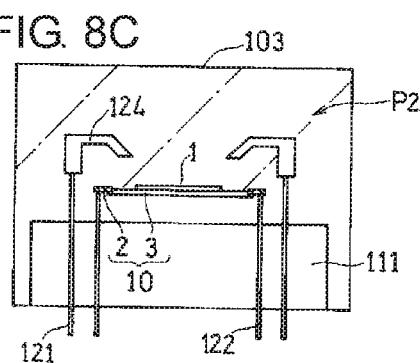
FIG. 8C is a conceptual view illustrating a part of the plasma treatment method according to the third embodiment.

In the present embodiment, processes from the preparation process to the carrying-in process (FIG. 8B) are carried out using a typical method, and the heating step (that is, irradiation with UV light) is performed after conveyance carrier 10 is placed on the upper end surfaces of support portions 122 and before conveyance carrier 10 is placed on stage 111, specifically, before support portions 122 start to be lowered (FIG. 8C). At this time, the heating step is performed by supplying a weak high-frequency power of approximately 200 W from first high-frequency power source 110A to generate weak plasma P2.

After the heating step, supporting portions 122 start to be lowered. After support portions 122 start to be lowered, holding sheet 3 is cooled and the tensile strength thereof is increased after the lowering of support portions 122 is finished and conveyance carrier 10 is placed on stage 111 (FIG. 8D) and before the plasma treatment process (FIG. 8E) is started. In this manner, substrate 1 is subjected to the plasma treatment in a state in which substrate 1 is bonded to holding sheet 3 which is not wrinkled.

The heating step (irradiation with UV light) may be performed during the lowering of support portions 122 (after the start of lowing and before the end of lowering) or may be performed in a state in which conveyance carrier 10 is placed on stage 111 after the lowering of support portions 122 is finished without limiting to the time before the lowering of supporting portions 122 is started. When conveyance carrier 10 is placed on stage 111, holding sheet 3 is cooled. However, holding sheet 3 is heated on stage 111 by generating plasma P2 in this state. In this case, when plasma P2 is stopped being generated, holding sheet 3 is cooled again and the tensile strength thereof is increased. In this manner, substrate 1 is subjected to the plasma treatment in a state in which substrate 1 is bonded to holding sheet 3 which is not wrinkled.

The plasma treatment method of the present disclosure is useful as a method of performing a plasma treatment on a substrate held by a holding sheet.

What is claimed is:

1. A method of manufacturing an electronic component, the method comprising:
   preparing a substrate which is bonded to a holding sheet of a conveyance carrier, the conveyance carrier including the holding sheet and a frame disposed on an outer peripheral portion of the holding sheet, the substrate having a circuit layer;
   heating the holding sheet after preparing the substrate;
   cooling the holding sheet after heating the holding sheet; and
   plasma etching the substrate to singulate the substrate into the electronic component in a state that the substrate is placed above a stage included in a plasma treatment apparatus and the substrate is in contact with the stage via the holding sheet,
   wherein the heating of the holding sheet and the cooling of the holding sheet are performed before the plasma etching of the substrate to singulate the substrate.

2. The method of manufacturing the electronic component according to claim 1,
   wherein in the preparing of the substrate, a resist mask is formed on a surface of the substrate, and
   wherein the heating of the holding sheet and the cooling of the holding sheet are performed in a state that the substrate is bonded to the holding sheet.

3. The method of manufacturing the electronic component according to claim 1,
   wherein the heating of the holding sheet and the cooling of the holding sheet increase a tensile strength of the holding sheet.

4. The method of manufacturing the electronic component according to claim 1,
   wherein the holding sheet includes a thermoplastic resin.

5. The method of manufacturing the electronic component according to claim 4,
   wherein the thermoplastic resin includes a polyolefin.

6. The method of manufacturing the electronic component according to claim 1,
   wherein during the heating of the holding sheet, the holding sheet is heated to a temperature approximately in a range of 50 degrees Celsius to 60 degrees Celsius.

7. The method of manufacturing the electronic component according to claim 1,
   wherein during the cooling of the holding sheet, the holding sheet is cooled to a temperature approximately in a range of −10 degrees Celsius to 20 degrees Celsius.

* * * * *